United States Patent
Machida et al.

(10) Patent No.: US 7,719,174 B2
(45) Date of Patent: May 18, 2010

(54) SURFACE MOUNTING DISCHARGE TUBE HAS SOLDERING TAPERS FORMED AT PERIPHERAL EDGES OF ELECTRODE SIDE SURFACES THAT SEAL AND PROJECT OUTWARDLY FROM OPPOSITE ENDS OF CYLINDRICAL CERAMIC ENVELOPE

(75) Inventors: Kazuhiko Machida, Nagano (JP); Kesayuki Takeuchi, Nagano (JP); Chisato Emori, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 548 days.

(21) Appl. No.: 11/114,190

(22) Filed: Apr. 26, 2005

(65) Prior Publication Data

US 2005/0285534 A1 Dec. 29, 2005

(30) Foreign Application Priority Data

Jun. 24, 2004 (JP) ............................. 2004-186016

(51) Int. Cl.
*H01J 17/26* (2006.01)
(52) U.S. Cl. .................................. 313/231.11; 313/623
(58) Field of Classification Search ........................ None
See application file for complete search history.

(56) References Cited

U.S. PATENT DOCUMENTS

| | | | | |
|---|---|---|---|---|
| 4,801,904 A | * | 1/1989 | Sakamoto et al. ........... 333/182 |
| 5,103,135 A | * | 4/1992 | Lange et al. ................. 313/623 |
| 5,569,972 A | * | 10/1996 | Lange ..................... 313/231.11 |
| 6,194,820 B1 | * | 2/2001 | Machida .................. 313/231.11 |
| 6,617,770 B2 | * | 9/2003 | Machida .................. 313/231.01 |
| 6,617,804 B2 | * | 9/2003 | Machida .................. 315/209 M |
| 2004/0094330 A1 | * | 5/2004 | Boy et al. .................... 174/260 |

FOREIGN PATENT DOCUMENTS

| | | |
|---|---|---|
| JP | 59-33690 | 3/1984 |
| JP | 60-39635 | 3/1985 |
| JP | 5-308179 | 11/1993 |
| JP | 10-335777 | 12/1998 |
| JP | 11-283859 | 10/1999 |
| JP | 2001-135453 | 5/2001 |
| JP | 2003-151716 | 5/2003 |
| JP | 2004-056112 | 2/2004 |

OTHER PUBLICATIONS

Machine translation of JP10-335777.*
Machine translation of JP05-308179.*
European Search Report, mailed Nov. 5, 2007 and issued in corresponding European Patent Application No. 05252301.6-1231.
Japanese Office Action issued May 1, 2009 in corresponding Japanese Patent Application 2004-186016.

* cited by examiner

*Primary Examiner*—Toan Ton
*Assistant Examiner*—Britt Hanley
(74) *Attorney, Agent, or Firm*—Staas & Halsey LLP

(57) ABSTRACT

A surface mounting discharge tube, comprise of a cylindrical ceramic envelope sealed at its two ends by side surfaces of electrodes, designed to be directly soldered on to a mounting board, where the electrodes at the two ends are rectangular, project outward radially at the ends of the ceramic envelope and are provided at peripheral edges at the side surfaces of the electrodes with soldering use tapers or step differences, whereby positional deviation at the time of soldering is suppressed and sufficient PCT properties are secured.

7 Claims, 2 Drawing Sheets

SURFACE MOUNTING DISCHARGE TUBE HAS SOLDERING TAPERS FORMED AT PERIPHERAL EDGES OF ELECTRODE SIDE SURFACES THAT SEAL AND PROJECT OUTWARDLY FROM OPPOSITE ENDS OF CYLINDRICAL CERAMIC ENVELOPE

BACKGROUND OF THE INVENTION

1. Field of the Invention

The present invention relates to a surface mounting discharge tube to be directly soldered on a printed circuit board.

2. Description of the Related Art

In general, a discharge tube is comprised of a cylindrical ceramic envelope sealed at its two ends by side surfaces of electrodes. It has been mounted on a printed circuit board in the past through lead wires provided at the end faces of the electrodes.

Mounting through lead wires means mounting the discharge tubes one at a time. There are however increasing demands for mounting a large number of discharge tubes all at once. Therefore, surface mounting directly on the printed circuit board without using lead wires has become necessary.

At that time, if just placing a cylindrical discharge tube as it is on a printed circuit board, it will roll around making positioning difficult. Therefore, the practice has been to provide flat parts at parts of the electrodes. See Japanese Unexamined Utility Model Publication (Kokai) No. 59-33690 (claims and FIGS. 2 to 5) and Japanese Unexamined Patent Publication (Kokai) No. 2003-151716 (claims and FIGS. 1 and 3). Further, surge absorbers, which have the same basic structure as discharge tubes, have been provided with electrodes of polygonal shapes for the same purpose. See Japanese Unexamined Patent Publication (Kokai) No. 2001-135453 (claims and FIG. 3).

Surface mounting means to place solder pallets at mounting positions on the printed circuit board, place the discharge tubes so that the soldering use flat parts at the peripheral edges of the electrodes are positioned there, insert the assembly into a heating furnace to melt the pallets, then remove the assembly and allow the solder to solidify for completing the bonding process.

However, such surface mounted discharge tubes suffer from the problem of positional deviation from the predetermined mounting positions at the time of soldering and therefore insufficient reliability in terms of pressure cooker test (PCT) properties etc.

SUMMARY OF THE INVENTION

An object of the present invention is to provide a surface mounting discharge tube suppressing occurrence of positional deviation at the time of soldering and provided with sufficient PCT properties.

To achieve the above object, according to the present invention, there is provided a surface mounting discharge tube, comprised of a cylindrical ceramic envelope sealed at its two ends by side surfaces of electrodes, designed to be directly soldered on to a mounting board, where the electrodes at the two ends are rectangular, project outward radially at the ends of the ceramic envelope and are provided at peripheral edges at the side surfaces of the electrodes with soldering use tapers or step differences.

The inventors discovered that if making the electrodes at the two ends rectangular and making them protrude outward radially from the ends of the ceramic envelope and providing bonding use tapers or step differences at the peripheral edges at the electrode side surfaces, it is possible to suppress positional deviation at the time of soldering for surface mounting and simultaneously secure sufficient reliability (in particular PCT properties) and thereby completed the present invention.

Further, the discharge tube of the present invention does not require lead wires, so the steps for forming lead wires in the production process can be eliminated and therefore the productivity can be improved.

BRIEF DESCRIPTION OF THE DRAWINGS

These and other objects and features of the present invention will become clearer from the following description of the preferred embodiments given with reference to the attached drawings, wherein:

FIG. 1(2) is a lateral sectional view of the same;

FIG. 2(2) is a lateral sectional view of the same.

DESCRIPTION OF THE PREFERRED EMBODIMENTS

Preferred embodiments of the present invention will be described in detail below while referring to the attached figures.

First Embodiment

Figure 1:
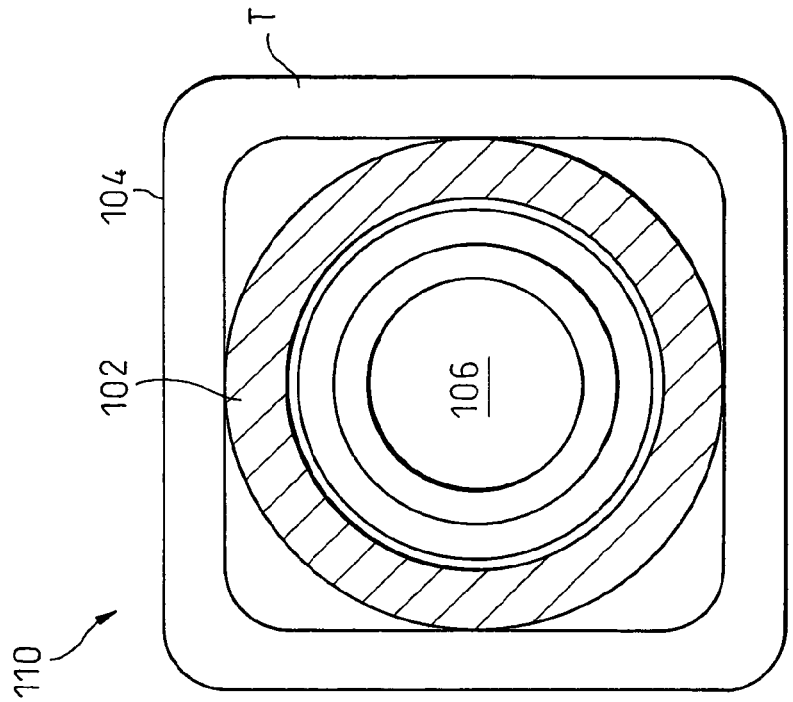
FIG. 1(1) is a longitudinal sectional view of a discharge tube provided with tapers at the peripheral edges of the electrode side surfaces according to an embodiment of the present invention.
Figure 1:
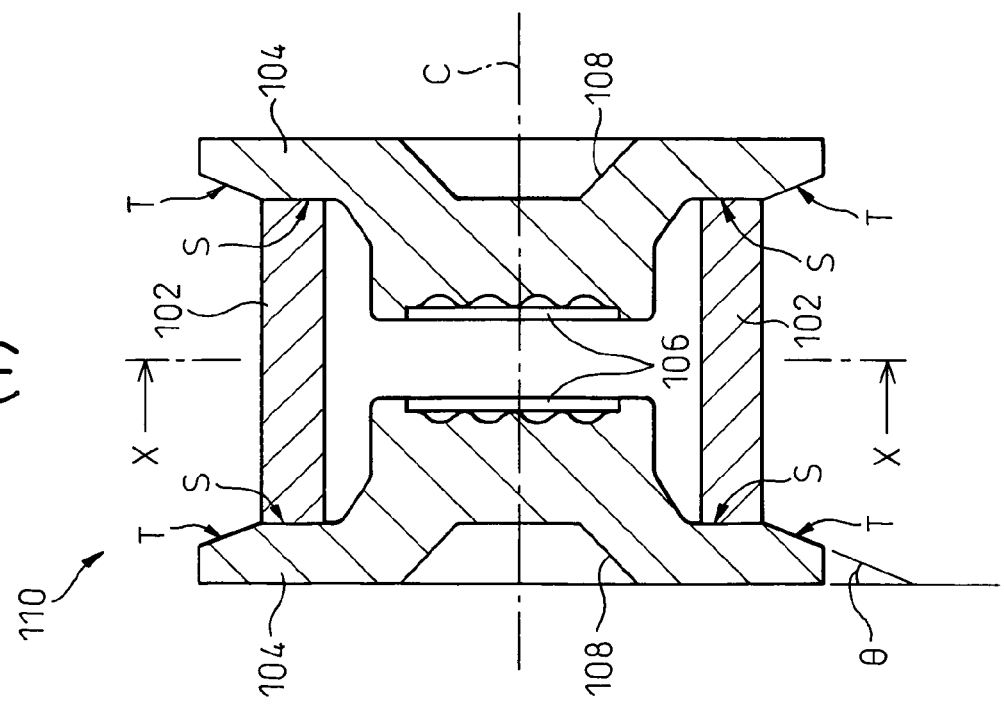

FIGS. 1(1) and 1(2) show an example of a surface mounting discharge tube according to the present invention. FIG. 1(1) is a longitudinal sectional view seen along the center axis of the cylindrical ceramic envelope of the discharge tube, while FIG. 1(2) is a lateral sectional view seen along the line X-X shown in FIG. 1(1).

The discharge tube 110 shown in FIGS. 1(1) and 1(2) is comprised of a cylindrical ceramic envelope 102 having a center axis C sealed at its two ends by side surfaces S of plate-shaped electrodes 104. The electrodes 104 are rectangular and protrude outward radially from the ends of the ceramic envelope 102 with respect to the center axis C. The peripheral edges of the side surfaces S of the electrodes 104 are provided with soldering use tapers T.

Note that recesses 106 with large number of sunken parts formed at the facing parts of the two electrodes 104, 104 at the center of the discharge tube are coated or filled with a substance for reliably generating and stably maintaining the discharge. The large number of sunken parts in the recesses 106 are shown as semispherical (illustration omitted in FIG. 1(2)).

Since the electrodes 104 are rectangular, they can be mounted at any of the four sides at the time of surface mounting. Due to this, positioning and potting for orientation at the time of mounting are unnecessary.

Since the electrodes 104 protrude outward radially from the ends of the ceramic envelope 102 with respect to the center axis C, clearance is secured between the surface of the printed circuit board and the ceramic envelope 102 of the discharge tube 110 at the time of mounting to the printed circuit board, so the PCT properties are improved.

As one effect due to this secured clearance, the solder melted at the time of surface mounting can be prevented from permeating into the bonded surfaces of the ceramic envelope 102 and the electrodes 104 by capillary action so it is possible to prevent short-circuits due to migration of solder at the time of application of power.

Since the peripheral edges of the side surfaces S of the electrodes 104 are provided with soldering use tapers T, the solder melted at the time of surface mounting use solder pallets will easily creep up the electrodes due to surface tension. As a result, positional deviation at the time of soldering can be suppressed and the soldering strength can be improved.

The above effect is obtained when the taper angle θ (see FIG. 1(1)) is in the range of 0°<θ<90°. The effect is particularly remarkable in the range of 0°<θ<45°. The greatest effect is confirmed near θ=25°.

Note that the centers of the outside surfaces of the electrodes 104 are formed with large dimples 108. These can be used as clamping parts at the time of transport of the discharge tubes 110 and reduce the volumes of the electrodes 104 and increase the surface areas, so improve the dissipation of heat.

Second Embodiment

Figure 2:
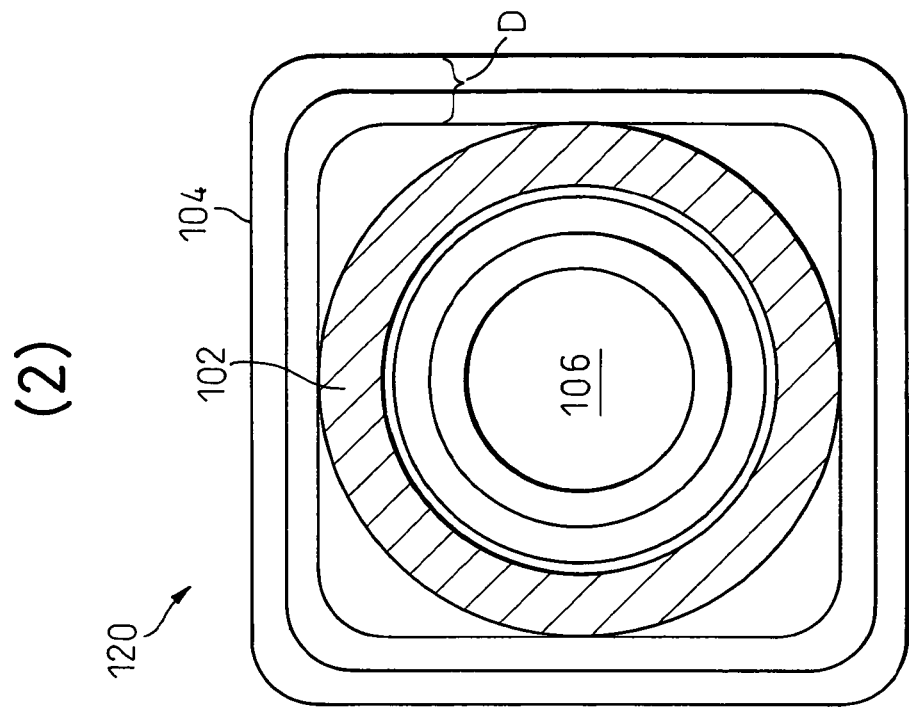
FIG. 2(1) is a longitudinal sectional view of a discharge tube provided with step differences at the peripheral edges of the electrode side surfaces according to another embodiment of the present invention.
Figure 2:
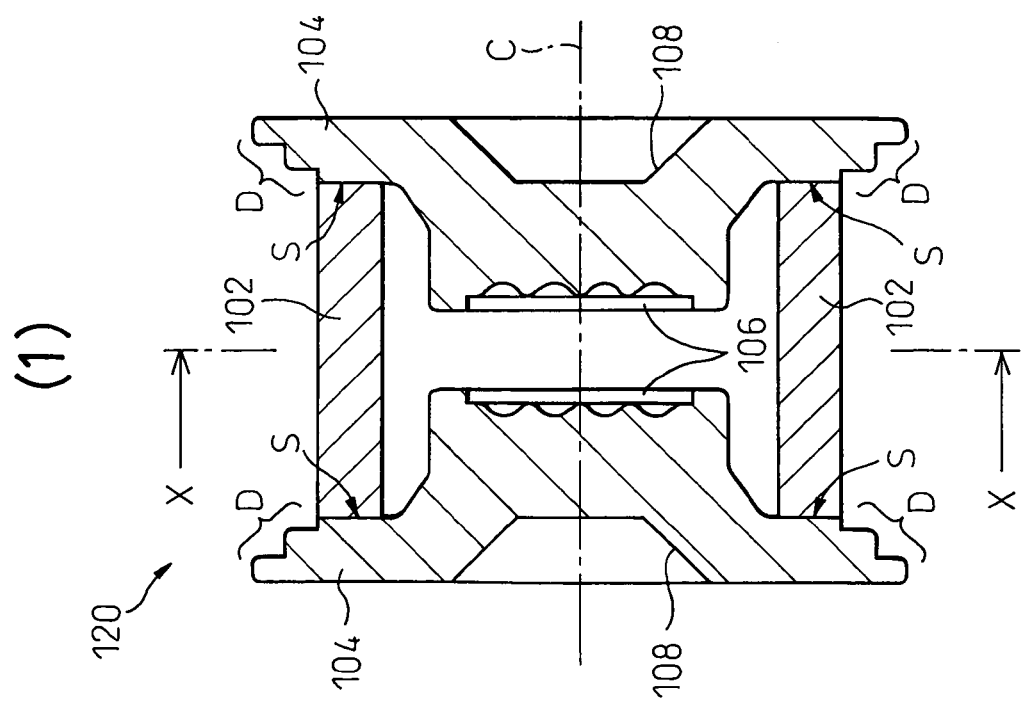

FIGS. 2(1) and 2(2) show another example of a surface mounting discharge tube according to the present invention. FIG. 2(1) is a longitudinal sectional view seen along the center axis of the cylindrical ceramic envelope of the discharge tube, while FIG. 2(2) is a lateral sectional view seen along the line X-X shown in FIG. 2(1).

The discharge tube 120 shown in FIGS. 2(1) and 2(2) is the same in structure as the discharge tube of FIGS. 1(1) and 1(2) except for the point of provision of soldering use step differences D at the peripheral edges of the side surfaces S of the electrodes 104. Parts corresponding to the discharge tube of FIGS. 1(1) and 1(2) are assigned the same reference notations.

The discharge tube 120 of this example is provided with soldering use step differences D at the peripheral edges of the side surfaces S of the electrodes 104 and thereby obtains the effect of prevention of positional deviation at the time of soldering and the effect of improvement of the soldering strength in the same way as with the soldering use tapers T of the discharge tube 110 of the first embodiment. The soldering use step differences, expressed by dimensions measured from the outside circumferences of the electrodes, generally are suitably 0.1 to 5 mm or so, preferably 1 to 2 mm or so, and preferably larger than the thicknesses of the solder pallets used for the soldering.

The other effects, that is the effect due to the electrodes 104 being rectangular, the effect due to the clearance secured between the surface of the printed circuit board and ceramic envelope 102, and the effect due to the dimples 108 provided at the centers of the outside surfaces of the electrodes 104 explained with respect to the first embodiment are obtained in the same way as the first embodiment.

Effect of Reduction of Lead Wire Forming Steps

In general, the following steps (1) to (4) are required for forming lead wires at electrodes:

(1) Spot welding the lead wires (bonding lead wires to centers of outer surfaces of electrodes)

(2) Processing the lead wires (bending the lead wires to form leg parts for bonding with the board)

(3) Checking for leaks (4) Checking for sparks

The discharge tube of the present invention does not use lead wires, so the steps (1) to (4) may be eliminated.

Further, the spot welding of the lead wires of step (1) is usually performed by resistance welding with application of 10 kg pressure as a standard. However, this system gives shock to the discharge tube body, so ends up giving a load to the soldered surfaces bonding the ceramic envelope and the electrodes and causes leakage of the sealed in gas due to microcracks. The present invention does not include any steps of forming lead wires, so is free from such a problem.

Note that in the above embodiments, the case was shown of the tapers T or the step differences D of the electrodes 104 provided at the peripheral edges of the inside side surfaces S of the electrodes 104. However, when no migration of solder due to creepage would occur, it is also possible not to provide the tapers T or step differences D at the peripheral edges of the inside side surfaces S, but provide the tapers T and the step differences D at the peripheral edges of the outside side surfaces of the electrodes 104 at the opposite sides to the inside side surfaces S.

The tapers T or step differences D of the electrodes 104 may also be provided at both of the peripheral edges of the inside side surfaces S of the electrodes 104 and the peripheral edges of the outside side surfaces at the opposite sides to the side surfaces S.

EXAMPLES

Example 1

Discharge tubes of the present invention given tapers at the peripheral edges of the electrode side surfaces and discharge tubes of the prior art with no tapers were subjected to surface mounting tests using solder pallets and measured for positional deviation at the time of soldering.

The taper angle θ shown in FIG. 1(1) was made 0° for the prior art examples (however, two types of no protrusion of electrodes (Prior Art Example 1) and with protrusion (Prior Art Example 2)) and 25°, 45°, and 75° for the examples of the present invention. The shapes of the samples were as follows:

<Shape of Samples>

Ceramic envelope: Outside diameter 0.8 mm×length 6.0 mm (cylindrical shape)

Electrode: 12.0 mm square, 2.0 mm thickness of outer edge (Prior Art Example 1 8.1 mm square)

Clearance from printed circuit board: 2.0 mm (0 clearance in Prior Art Example 1)

The surface mounting test was performed as follows: Procedure of Surface Mounting Test (1) Solder pallets (length 12.5 mm, width 2.0 mm, thickness 1.5 mm) were placed on a printed circuit board.

(2) A sample discharge tube was placed on the solder pallets and measured for initial positions in the axial direction of the cylinder of the discharge tube (X-direction) and the perpendicular direction of the discharge tube (Y-direction).

(3) The assembly was loaded into a solder melting furnace and heated to 350° C.

(4) The assembly was taken out from the solder melting furnace and cooled to ordinary temperature, then the sample was measured for positions in the X-direction and Y-direction. The positional deviation at the time of soldering was calculated from the differences from the initial positions.

The same test was conducted on five similar samples (number of repetitions n=5). The test results are shown in Table 1.

TABLE 1

| | Positional Deviation (mm) | | | | | | | | | |
|---|---|---|---|---|---|---|---|---|---|---|
| | Prior art | | | | Present invention | | | | | |
| | Taper angle 0° (1) | | Taper angle 0° (2) | | Taper angle 25° | | Taper angle 45° | | Taper angle 75° | |
| No. | X | Y | X | Y | X | Y | X | Y | X | Y |
| 1 | 2.8 | 1.8 | 1.2 | 2.5 | 0.1 | 0.2 | 0.3 | 0.4 | 0.4 | 0.9 |
| 2 | 3.6 | 1.2 | 1.4 | 1.6 | 0.1 | 0.2 | 0.3 | 0.5 | 0.5 | 0.9 |
| 3 | 1.2 | 3.3 | 1.3 | 1.8 | 0.2 | 0.3 | 0.2 | 0.3 | 0.6 | 1.1 |
| 4 | 3.1 | 1.9 | 1.6 | 1.3 | 0.2 | 0.1 | 0.3 | 0.4 | 0.3 | 0.8 |
| 5 | 1.1 | 2.4 | 2.2 | 1.5 | 0.1 | 0.2 | 0.2 | 0.4 | 0.5 | 0.9 |

The tapered samples of the present invention all were greatly reduced in positional deviation at the time of soldering compared with the prior art examples with no tapers.

Prior Art Example 1 had no taper and had no protrusion of the electrodes, that is, no clearance formed between the ceramic envelope and the printed circuit board. It exhibited the most conspicuous positional deviation of 1.1 to 3.6 mm in the X-direction (discharge tube cylindrical axial direction) and 1.2 to 3.3 in the Y-direction. The variation in the positional deviation was also great.

Prior Art Example 2 had no taper, but had protrusion of the electrodes, so a clearance of 2 mm was secured between the ceramic envelope and the printed circuit board. The positional deviation was 1.2 to 2.2 mm in the X-direction and 1.3 to 2.5 mm in the Y-direction or smaller than the Prior Art Example 1. The variation was also smaller.

As opposed to this, in the examples of the present invention, in the tested range, the positional deviation was smallest with a taper angle θ of 25°, that is, 0.1 to 0.2 mm in the X-direction and 0.1 to 0.3 mm in the Y-direction or reduced to one-tenth the level of the prior art examples. As the taper angle θ became larger to 45° and 75°, the positional deviation gradually increased as a trend, but even in the example of the present invention with the largest positional deviation taper angle θ of 75°, the level was a fraction of that of the prior art examples or 0.3 to 0.6 mm in the X-direction and 0.8 to 1.1 in the Y-direction.

Example 2

Discharge tubes of the present invention given tapers at the electrode edges and discharge tubes of the prior art without tapers were surface mounted using solder pallets in the same way as in Example 1 and were subjected to pressure cooker tests (PCT) after mounting.

The taper angles θ of the electrode edges of the discharge tubes were made 0° in the prior art examples (two types: one with no electrode protrusion (Prior Art Example 1) and one with electrode protrusion (Prior Art Example 2)) and 25° and 75° in the examples of the present invention.

The shape of the discharge tube sample was the same as in Example 1.

The PCT test was conducted under the following conditions:
<PCT Test Conditions>
Temperature: 120° C.
Humidity: 100% (saturation state)
Pressure: 0.150 MPa
Power: Constant application of DC 500V
Time: 100 hours to 800 hours (cumulative)
Evaluation: Passing standard/insulation resistance of at least 1000 MΩ for 500 hours maintained After the PCT test, the insulation resistance was measured. The results are shown in Table 2.

TABLE 2

| | Insulation Resistance (MΩ) | | | |
|---|---|---|---|---|
| | Prior art | | Present invention | |
| Cumulative discharge time (hr) | Taper angle 0° (1) | Taper angle 0° (2) | Taper angle 25° | Taper angle 75° |
| 100 | >10000 | >10000 | >10000 | >10000 |
| 200 | 600 | >10000 | >10000 | >10000 |
| 300 | — | >10000 | >10000 | >10000 |
| 400 | — | 1000 | >10000 | >10000 |
| 500 | — | 500 | >10000 | >10000 |
| 600 | — | — | >10000 | 7000 |
| 700 | — | — | >10000 | — |
| 800 | — | — | >10000 | — |

All of the samples of the examples of the prior art and examples of the present invention maintained insulation resistances of at least 10000 MΩ (measurable upper limit) up to 100 hours.

Prior Art Example 1 (no taper, no clearance) dropped in insulation resistance to 600 MΩ already at 200 hours, while Prior Art Example 2 dropped to 500 MΩ at 500 hours. Neither reached the passing standard.

As opposed to this, the examples of the present invention (with tapers, clearance secured) all maintained an insulation resistance of at least 10000 MΩ (measurable upper limit) after 500 hours or exhibited properties more than 10 times better than the standard for passing. In particular, in the case of a taper angle θ of 25°, an insulation resistance of at least 10000 MΩ was maintained even after 800 hours. Even in the case of a taper angle θ of 75°, an insulation resistance of 7000 MΩ corresponding to seven times the passing standard is maintained after 600 hours.

Observing the state after surface mounting, as a phenomenon distinctive to the prior art examples with no tapers at the peripheral edges of the electrode side surfaces, air bubbles remained at the bonded parts of the electrodes and ceramic envelope and between the ceramic envelope and printed circuit board. This was not observed in the examples of the present invention giving tapers to the peripheral edges of the electrode side surfaces. In the prior art examples, the presence of the air bubbles may become a factor promoting insulation degradation.

Summarizing the effects of the invention, according to the present invention, it is possible to provide a surface mounting discharge tube suppressing occurrence of positional deviation at the time of soldering and provided with sufficient reliability (in particular PCT properties).

While the invention has been described with reference to specific embodiments chosen for purpose of illustration, it should be apparent that numerous modifications could be made thereto by those skilled in the art without departing from the basic concept and scope of the invention.

What is claimed is:

1. A surface mounting discharge tube, comprising:

a cylindrical ceramic envelope sealed at its two ends by side surfaces of electrodes, designed to be directly soldered onto a mounting board, where the electrodes at the two ends are rectangular, project outward radially at the ends of the ceramic envelope and are provided at peripheral edges at the side surfaces of the electrodes with soldering use tapers or step distance, where the step distance or taper is provided on the side surface of the electrode on the side that is to be connected to the ceramic envelope, and the step distance or taper of the electrode is exposed from the outside of the ceramic envelope, wherein the rectangular electrodes have four sides, each side being capable of mounting the discharge tube onto a printed circuit board, and the tapers or step distance are formed so that the electrode has a thickness increasing from the four sides toward a center axis of the cylindrical ceramic envelope.

2. A surface mounting discharge tube as set forth in claim 1, wherein said soldering use tapers at the edges of the electrodes have a taper angle $\theta$ based on said electrode side surfaces of $0°<\theta<\pi°$.

3. A surface mounting discharge tube as set forth in claim 2, wherein said taper angle $\theta$ is $0°<\theta<45°$.

4. A surface mounting discharge tube as set forth in claim 1, wherein said soldering use step distance at the edges of the electrodes is 0.1 to 5 mm.

5. A surface mounting discharge tube as set forth in claim 4, wherein said step distance is larger than the thicknesses of solder pallets used for said soldering.

6. A surface mounting discharge tube of claim 1, the tapers or step distance are formed on the side surfaces of the electrodes.

7. A surface mounting discharge tube comprising:

a cylindrical ceramic envelop sealed at its two ends by side surfaces of rectangular electrodes;

the rectangular electrodes having four sides, each side being capable of mounting the discharge tube onto a printed circuit board, that project outward radially at the ends of the ceramic envelope, and having an area at the side surfaces that is capable of being soldered having a specific taper angle or step distance, where the step distance or taper angle is provided on the side surface of the electrode on the side that is to be connected to the ceramic envelope, and the step distance or taper angle of the electrode is exposed from the outside of the ceramic envelope.

* * * * *

UNITED STATES PATENT AND TRADEMARK OFFICE
CERTIFICATE OF CORRECTION

PATENT NO. : 7,719,174 B2  Page 1 of 1
APPLICATION NO. : 11/114190
DATED : May 18, 2010
INVENTOR(S) : Kazuhiko Machida et al.

It is certified that error appears in the above-identified patent and that said Letters Patent is hereby corrected as shown below:

Column 7, Line 24, change "$\pi°$." to --$90°$.--.

Signed and Sealed this

Fourteenth Day of September, 2010

David J. Kappos
*Director of the United States Patent and Trademark Office*